(12) United States Patent
Sato et al.

(10) Patent No.: US 7,724,591 B2
(45) Date of Patent: May 25, 2010

(54) SEMICONDUCTOR MEMORY DEVICE AND LOCAL INPUT/OUTPUT DIVISION METHOD

(75) Inventors: Takenori Sato, Tokyo (JP); Kazuteru Ishizuka, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 125 days.

(21) Appl. No.: 12/169,947

(22) Filed: Jul. 9, 2008

(65) Prior Publication Data
US 2009/0016092 A1    Jan. 15, 2009

(30) Foreign Application Priority Data
Jul. 10, 2007    (JP) .............................. 2007-181028

(51) Int. Cl.
*G11C 29/00* (2006.01)
*G11C 7/00* (2006.01)
(52) U.S. Cl. ........................................ 365/200; 365/51
(58) Field of Classification Search ................. 365/200, 365/51, 201
See application file for complete search history.

(56) References Cited

U.S. PATENT DOCUMENTS 5,970,003 A * 10/1999 Miyatake et al. ............ 365/200
6,172,921 B1 * 1/2001 Park et al. ................... 365/200
6,324,104 B1 * 11/2001 Matsui ........................ 365/200
7,002,858 B2 * 2/2006 Lee ............................. 365/200

FOREIGN PATENT DOCUMENTS

JP    2005346922 A    12/2005
JP    2007-87436 A    4/2007

* cited by examiner

*Primary Examiner*—Anh Phung
(74) *Attorney, Agent, or Firm*—Sughrue Mion, PLLC

(57) ABSTRACT

A semiconductor memory device includes: a memory cell array that is arrayed on a plurality of mats; an even number of redundancy Y-switch (YS) signal lines that are provided in three mat units and arranged in the bit line direction on the mat that is positioned in the middle among the three mats disposed continuously in the word line direction; a local input/output (LIO) line that is connected to a sense amplifier portion of the three mats, extends in the word line direction, and is divided in two in a redundancy area that is a part of the even number of redundancy Y switch signal lines; and a plurality of bit line selecting Y switch signal lines that connect bit line output of the memory cell array on the three mats to the local input/output line; wherein 8-bit data prefetch is performed from the three mats by selecting the plurality of bit line selecting Y switch signal lines and turning them ON simultaneously so as to connect the selected bit line output to each local input/output line divided in two.

9 Claims, 12 Drawing Sheets

FIG. 4

SPECIFICATION (1)

| ITEM | 1GDDR3 | | |
|---|---|---|---|
| | Row | Col | Row-Col NUMBER DIFFERENCE |
| REPLACEMENT SPECIFICATION | 64R/64M | 6C/4M | |
| FUSE NUMBER /CHIP | 14336 | 12288 | 2048 |

SPECIFICATION (2)

| ITEM | 1GDDR3 | | |
|---|---|---|---|
| | Row | Col | Row-Col NUMBER DIFFERENCE |
| REPLACEMENT SPECIFICATION | 48R/64M | 5C/4M | |
| FUSE NUMBER /CHIP | 10752 | 10240 | 512 |

SPECIFICATION (3)

| ITEM | 1GDDR3 | | |
|---|---|---|---|
| | Row | Col | Row-Col NUMBER DIFFERENCE |
| REPLACEMENT SPECIFICATION | 32R/64M | 4C/4M | |
| FUSE NUMBER /CHIP | 7168 | 8192 | 1024 |

SEMICONDUCTOR MEMORY DEVICE AND LOCAL INPUT/OUTPUT DIVISION METHOD

Priority is claimed on Japanese Patent Application No. 2007-181028, filed Jul. 10, 2007, the content of which is incorporated herein by reference.

BACKGROUND OF THE INVENTION

1. Field of the Invention

The present invention relates to a semiconductor memory device and a local input/output division method.

2. Description of Related Art

As a conventional semiconductor memory device, Japanese Unexamined Patent Application No. 2007-87436 discloses a semiconductor memory device which controls switching of routes of latch circuits for external transfer in order to reduce current consumption at a high-speed operation while preventing malfunction at low-speed operation. Also, a conventional synchronous semiconductor memory device disclosed in Japanese Unexamined Patent Application No. 2005-346922 has as its object to provide an SDRAM in which bit constitution can be switched and area penalty is reduced.

Further, a Double Data Rate 3 (DDR3) standard has been proposed for a semiconductor device, such as a Synchronous DRAM (SDRAM), to improve a data read-out speed compared to a 3-mat architecture that is used in a Double Data Rate 2 (DDR2) standard.

SUMMARY

The present invention provides a semiconductor memory device such as Double Data Rate 3 (DDR3) Synchronous DRAM (SDRAM), and particularly to a semiconductor device capable of dividing a local input/output (LIO) on a mat in order to achieve a 8-bit pre-fetch of DDR3 in the 3-mat architecture that is used in Double Data Rate 2 (DDR2).

A semiconductor memory device of the present invention includes: a memory cell array that is arrayed on a plurality of mats; an even number of redundancy Y-switch (YS) signal lines that are provided in three mat units and arranged in the bit line direction on the mat that is positioned in the middle among the three mats disposed continuously in the word line direction; a local input/output (LIO) line that is connected to a sense amplifier portion of the three mats, extends in the word line direction, and is divided in two in a redundancy area that is a part of the even number of redundancy Y switch signal lines; and a plurality of bit line selecting Y switch signal lines that connect bit line output of the memory cell array on the three mats to the local input/output line; wherein 8-bit data prefetch is performed from the three mats by selecting the plurality of bit line selecting Y switch signal lines and turning them ON simultaneously so as to connect the selected bit line output to each local input/output line divided in two.

In the semiconductor memory device having the above constitution, since 8-bit prefetch is required in, for instance, 1 Gigabit DDR3 (1GDDR3), a local input/output (LIO) is divided on mat 2 which is in the middle of the three mats mat 1, mat 2, and mat 3.

Thereby, it is possible to divide LIO on the mat in the 3-mat architecture of DDR2, and it is possible to realize 8-bit prefetch of DDR3.

BRIEF DESCRIPTION OF THE DRAWINGS

The above features and advantages of the present invention will be more apparent from the following description of certain preferred embodiments taken in conjunction with the accompanying drawings, in which:

FIG. 4 shows an example of the fuse number in the semiconductor memory device of the embodiment of the present invention;

DETAILED DESCRIPTION OF THE PREFERRED EMBODIMENTS

Before describing the embodiments of the present invention, the related art will be explained in detail with reference to the drawings in order to facilitate the understanding of the embodiments of the present invention.

Figure 8:
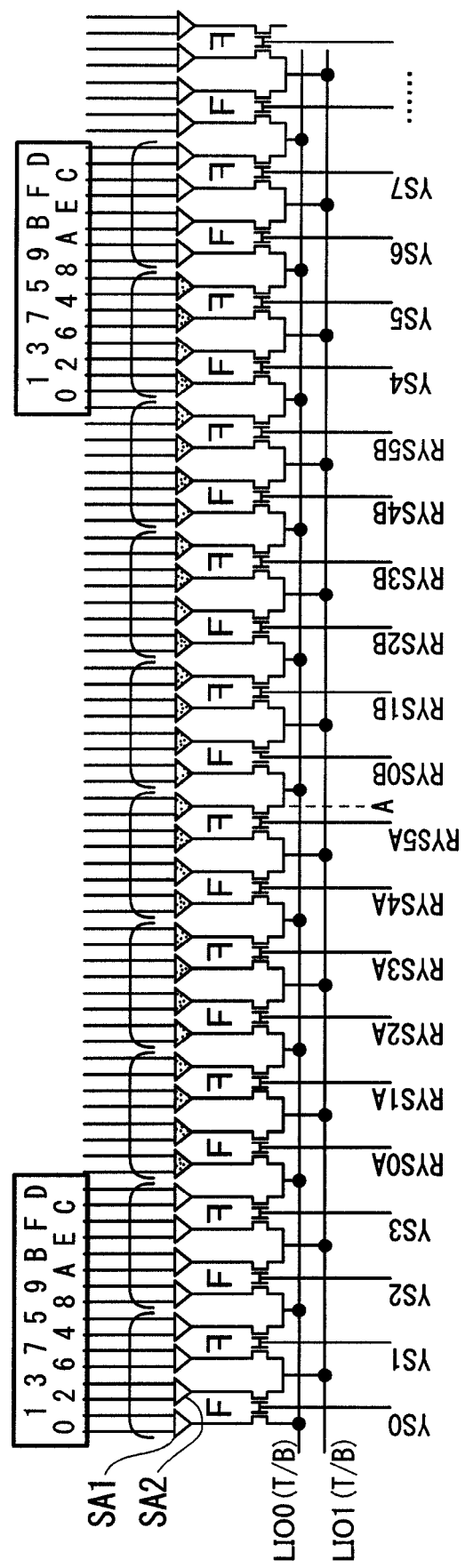
FIG. 8 shows a first example of cutting LIO in the related art.

In the semiconductor memory device of the related art, sense amplifiers (SA) are formed on a substrate in pairs. For example, as shown in FIG. 8, two sense amplifiers SA1 and SA2, for instance, represented by triangles are provided in pairs with each pair being denoted by the symbol F. The amplifiers SA1 and SA2 are driven by a Y switch (YS) signal line YS0 for the purpose of bit line selection. Also, in order to equally place the bit map patterns, and YS signal lines for bit line selection of an even number are placed.

Figure 5:
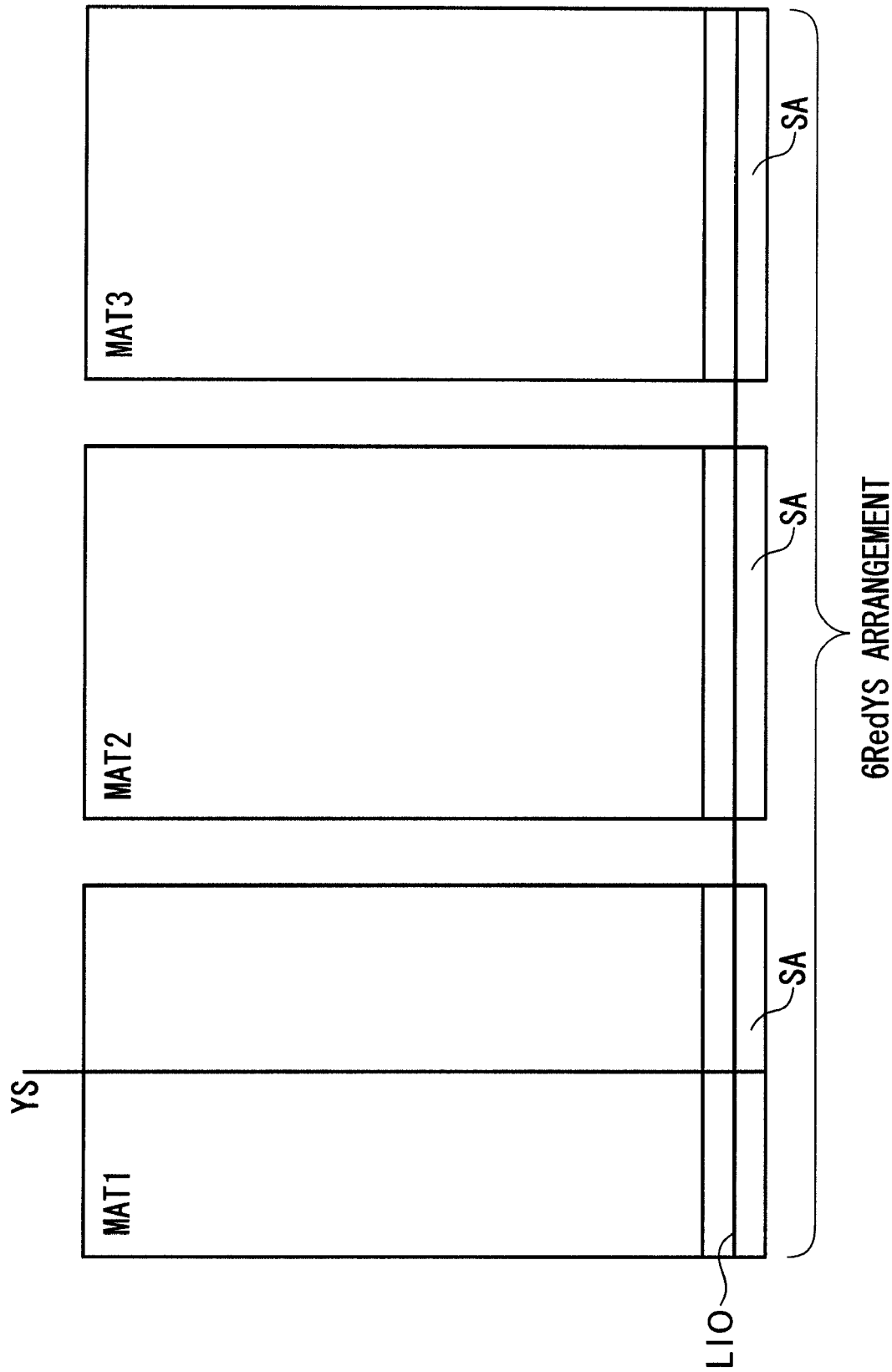
FIG. 5 shows a first example of the relationship of YS of 1GDDR2 and LIO in the related art.

FIG. 5 shows the relationship between a selected YS signal line and a local input/output (LIO) line that are layout configured by 1GDDR2DRAM (Double Data Rate 2 Dynamic Random Access Memory) having a 1 G memory size. The LIO is a local data signal line for transmitting SA signals selected by YS to a main I/O (MIO).

The SA portion that corresponds to 6RedYS (six redundancy YS) for a redundancy circuit for replacement of defective memory cells in the DDR2 architecture is arranged every 3 mats (hereinafter such arrangement may be referred to as 6RedYS/3MAT). Accordingly, as shown in FIG. 5, the LIO line is formed with a length of 3 mat portions. Mats 1, 2, 3 are blocks of a memory cell that constitute a memory cell array, and, for example, the memory capacity of 1 mat is "512WL× (88YS×4SA)=180224 bits".

Figure 6:
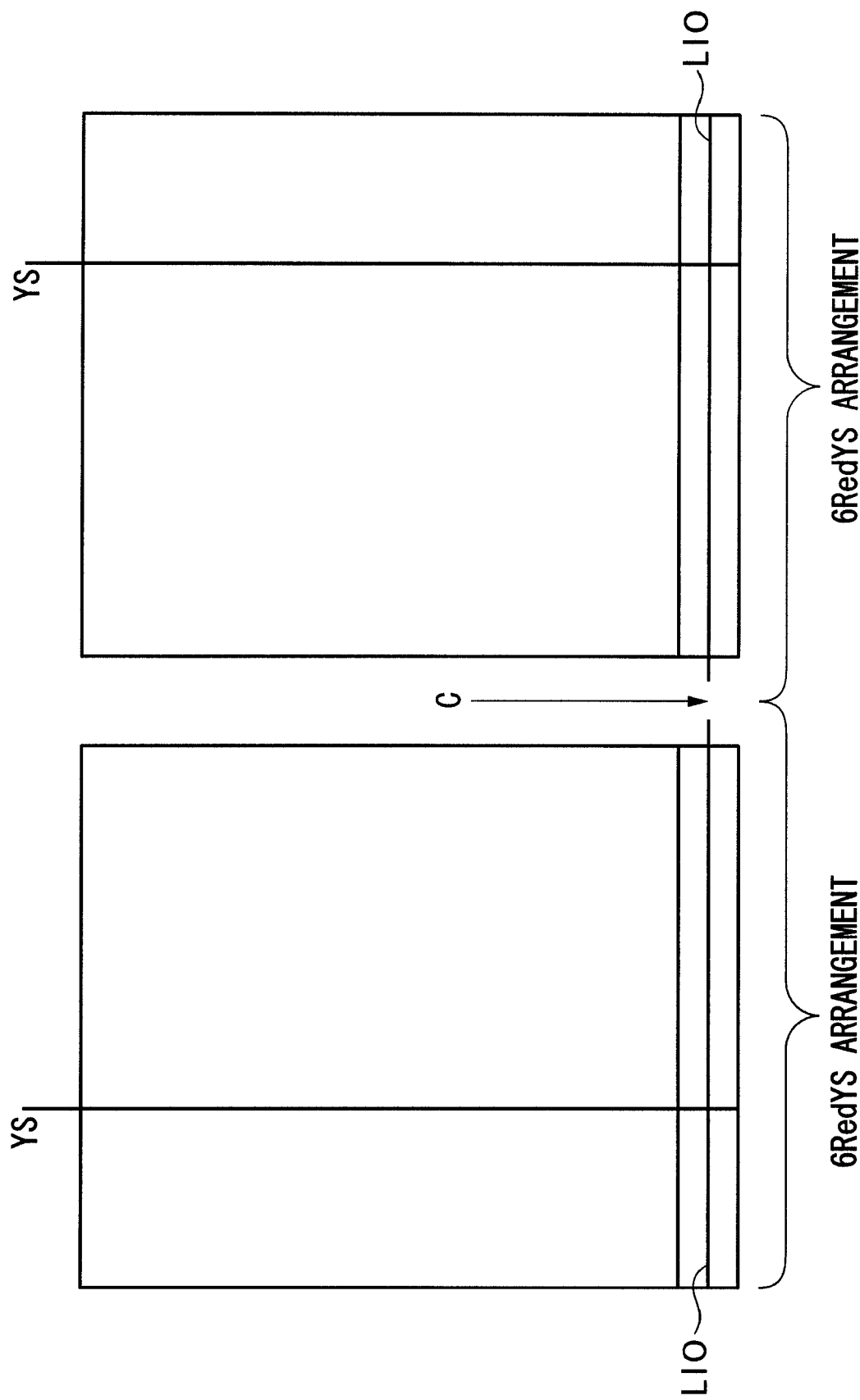
FIG. 6 shows a second example of the relationship of YS of 1GDDR2 and LIO in the related art.
Figure 7:
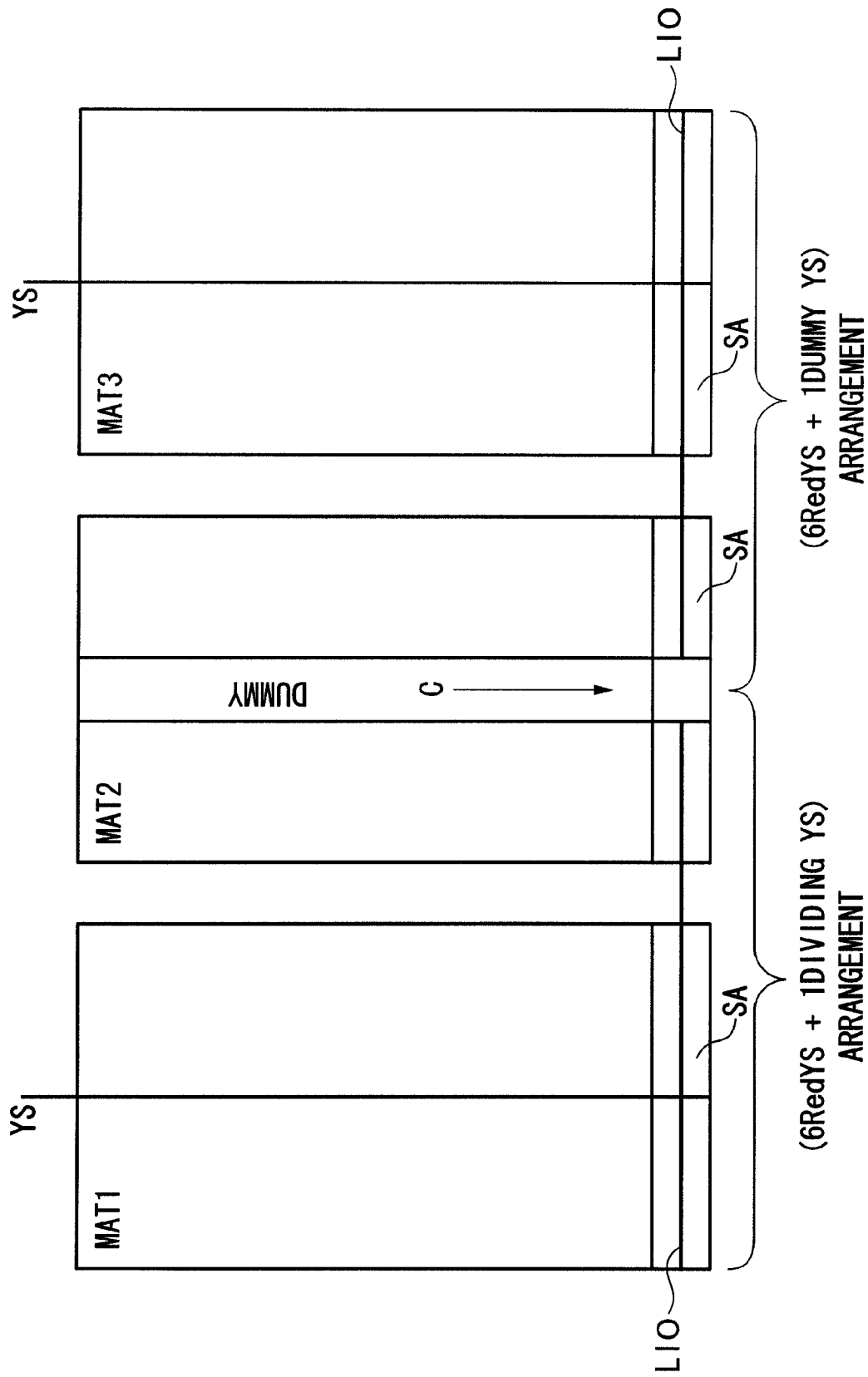
FIG. 7 shows a third example of the relationship of YS of 1GDDR2 and LIO in the related art.

FIG. 6 and FIG. 7 show examples of methods for realizing the DDR3 architecture. In contrast to the DDR2 architecture that performs 4-bit prefetch, DDR3 (Double Data Rate 3) architecture performs 8-bit prefetch, so it is necessary to divide the LIO in the arrow C portion. In these constitutions, 8-bit data is read to the LIO by selecting two YS signal lines and turning these two YSs ON simultaneously. In this case, as shown in FIG. 6, even if the mat number is changed to two, the number of SA does not change. However, since the length of the SWL (sub-word line) becomes longer, the internal operation speed of the memory cell array falls. In the case of changing from DDR2 to DDR3, in order to ensure that the performance of the memory cell array does not change, it is necessary to make the mat number into a 3-mat architecture as shown in FIG. 7, similarly to DDR2.

That is, in 1 Gigabit DDR2 (1GDDR2), LIO division is unnecessary for 4-bit prefetch. However, in 1GDDR3, when attempting to realize 8-bit prefetch without altering the mat configuration of the memory cell array from 1GDDR2 due to 8-bit prefetch, that is, so as to not change the layout size, the LIO division on the mat becomes necessary in order to perform 8-bit prefetch with two YSs.

In the case of realizing DDR3 in this 3 mat architecture, the following problems arise.

Due to the formation by pairing SA portions in the related art, there is the restriction that it is necessary to set an even number of YS signal lines for replacement. For this reason, when setting dummy cells for dividing the LIO on the mat, a first problem is that a layout area is required for the purpose of division due to using an even number of YS (in this case the minimum number being two) as dummies.

Figure 9:
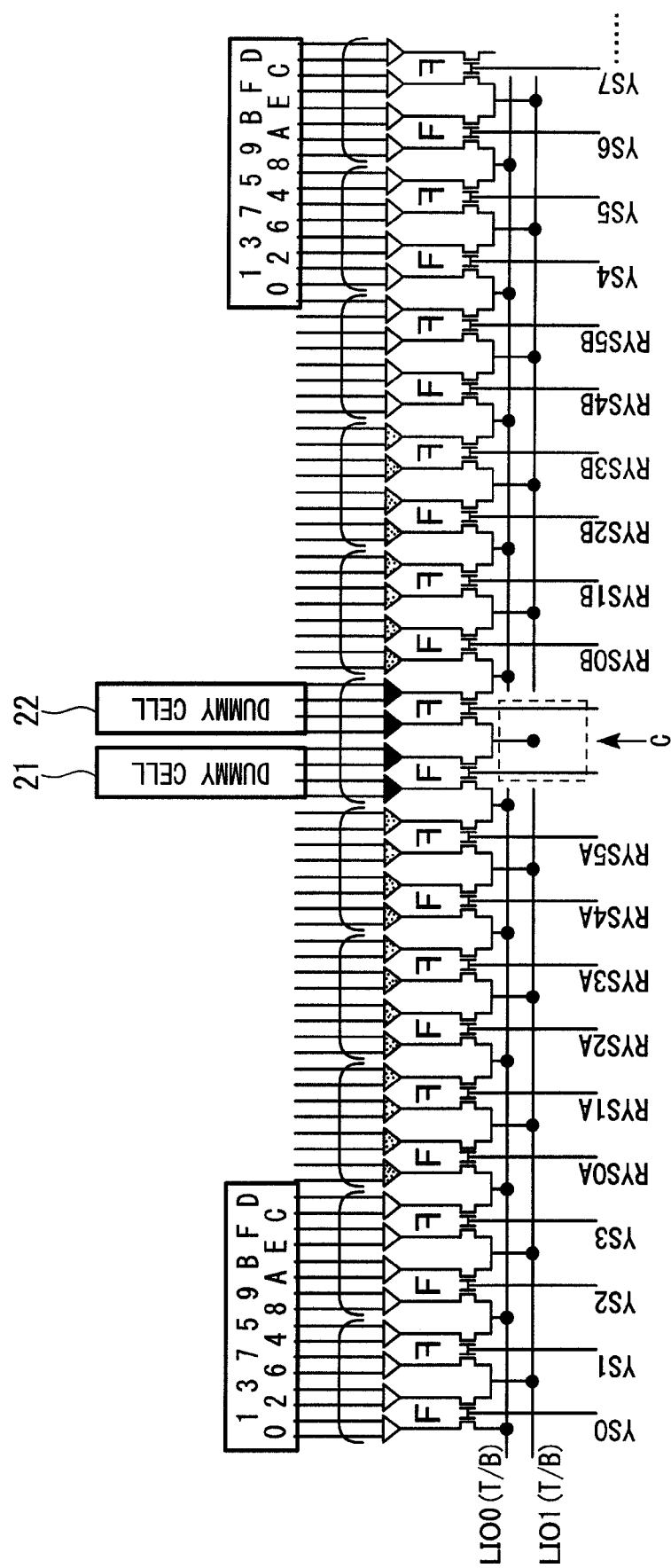
FIG. 9 shows a second example of cutting LIO in the related art.

That is, as shown in FIG. 9, in the case of adding (arranging) dummy cells 21, 22 and cutting the LIO on the mat, the problem arise of the mat layout size becoming greater.

Referring back to FIG. 8, the reason of being unable to cut the LIO line on a mat will be described. FIG. 8 is a magnified view of the redundancy portion that is positioned in the middle row portion in the middle MAT2 among the three mats shown in FIG. 7. In the example shown in FIG. 8, there is an example (6RedYS/1.5 mat) of providing 12 redundancy YS (RedYS) signal lines RYS0A to RYS5A, RYS0B to RYS5B in order to correspond to DDR3. Only those YS signal lines in the vicinity of the redundancy YS signal lines for the description of cutting way in the redundancy portion are shown.

As shown in FIG. 8, even when attempting to cut the LIO line at point A without using dummy YS, it is not possible to perform LIO division due to the transistors on the RYS5A side and RYS0B side sharing the same diffusion layer.

In 1GDDR3, when a fuse (anti-fuse) of the Row/Col is collectively formed in a fuse area for each row and column, it is preferable to arrange the fuse number of Row/Col to be as equal as possible. However, when forming the YS for dividing the LIO line in the redundancy area, it is necessary to use an even number of YS as dummies as mentioned above, and so the Row fuse number increases. For this reason, a second problem arises of the Row/Col fuse number difference enlarging.

A third problem arises of the addressing changing occurred on both sides of the redundancy area in the case of temporarily using the layout region of the 2YS portion and using 1YS portion as a layout separation with the redundancy YS an odd number.

Figure 10:
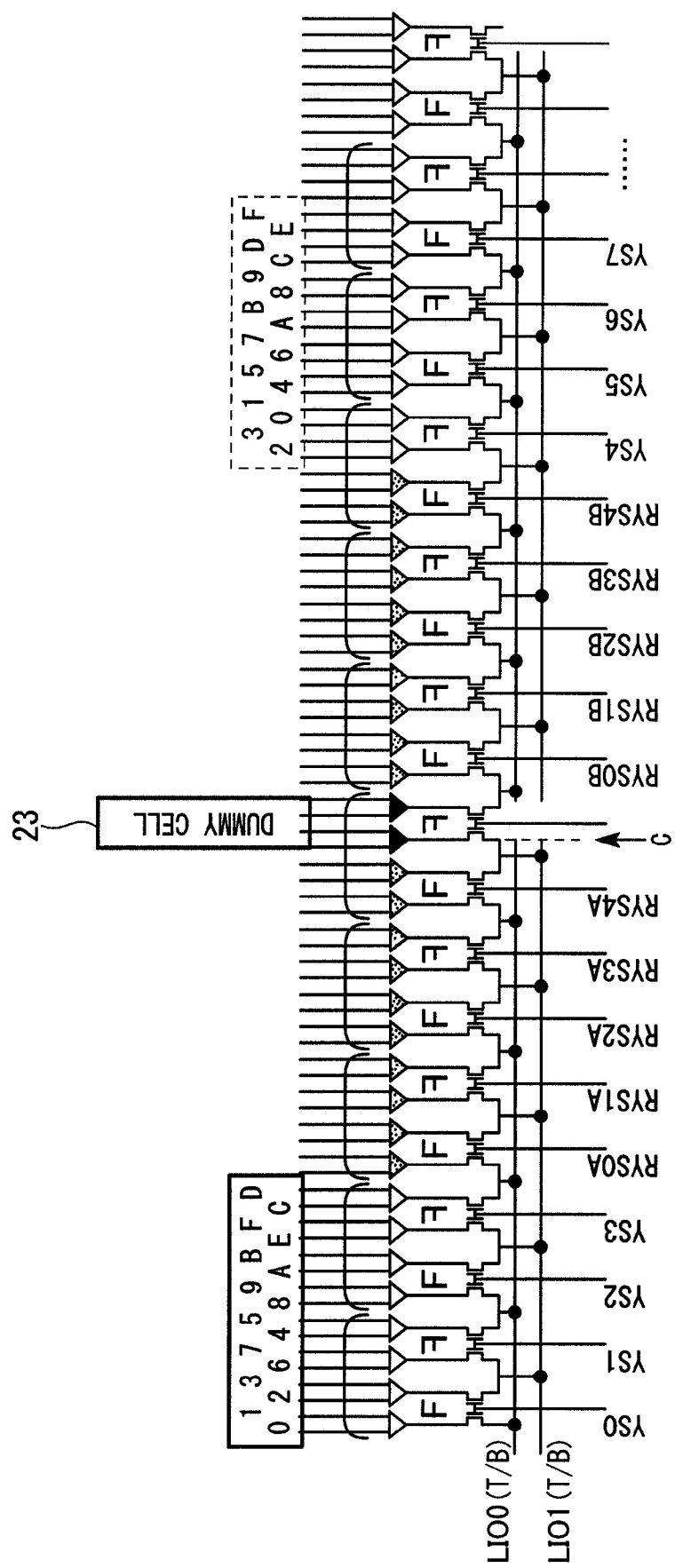
FIG. 10 shows a third example of cutting LIO in the related art.

For example, as shown in FIG. 10, it is conceivable to perform cutting of the LIO line at position C on the dummy YS portion that corresponds to the dummy cell 23 in the redundancy area and making the redundancy YS signal lines of the left and right mats after cutting into an odd number (5).

In this case, after cutting of the LIO line, the address in the portion at YS signal line YS4 changes, and the addressing configuration can no longer be maintained.

Figure 11:
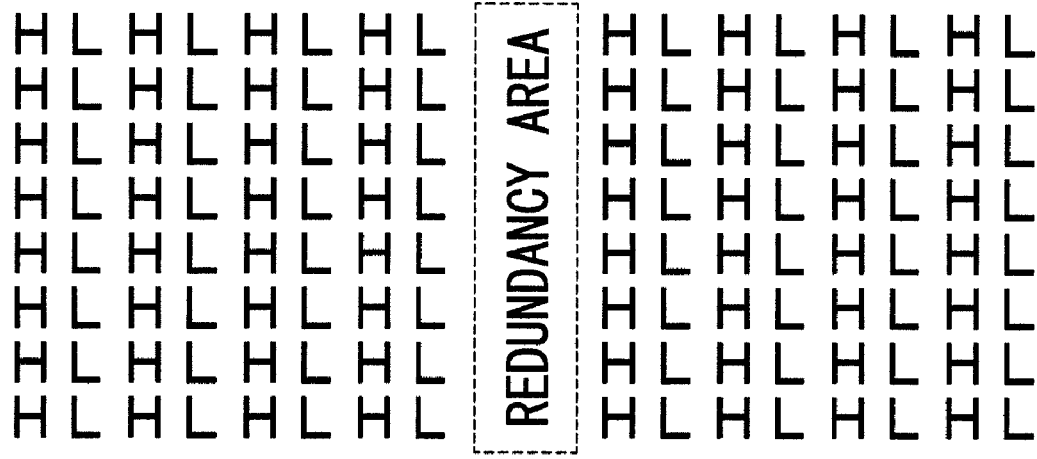
FIG. 11 shows a pattern example in the case of maintaining the addressing configuration of the embodiment of the present invention.
Figure 12:
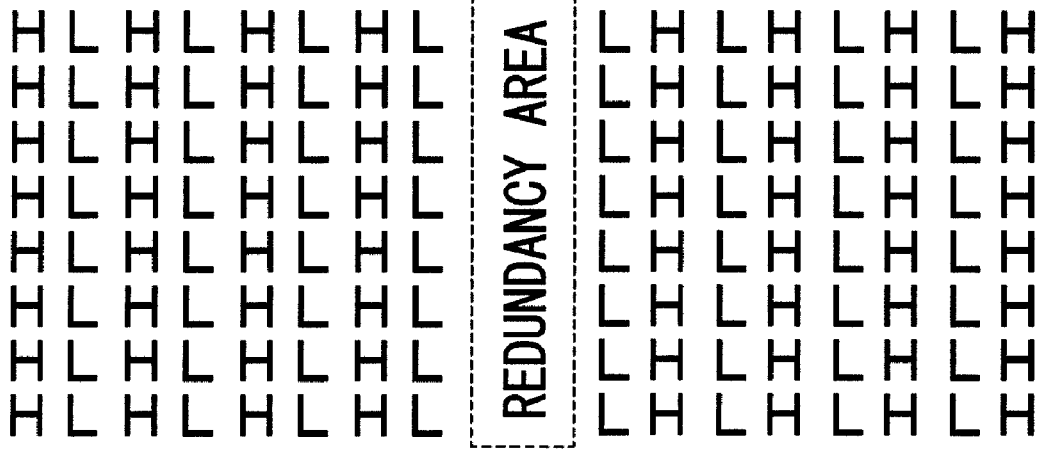
FIG. 12 shows a pattern example in the case of the addressing configuration differing.

FIG. 11 and FIG. 12 are drawings showing examples of addressing patterns. FIG. 11 shows an example of a pattern in the case of maintaining the addressing configuration, and FIG. 12 shows an example of a pattern that corresponds to the pattern shown in FIG. 11 in the case of the addressing configuration differing. As shown in FIG. 12, in the case of the addressing configuration differing, the pattern changes on both sides of the redundancy area.

In this way, the following problems occur when the addressing configuration breaks up. For example, due to the physical pattern changing, the address SCR, i.e., address scramble that performs address conversion on the input address, becomes necessary. Also, in the sampling test, the possibility of not being tested increases for the portion that differs of the addressing configuration, and so there is a possibility of missing a defect. Moreover, when the addressing differs, the test pattern number increases, which leads to an increase in the test time.

To summarize the above, in the case of changing from DDR2 to DDR3, it is necessary to adopt a 3-mat architecture in which the division number is the same as for DDR2 in order to insure that the performance of the memory cell array does not change.

In the case of realizing DDR3 in this 3-mat architecture, since it is necessary to perform 8-bit prefetch using two YS that are selected, LIO division on the mat becomes necessary. However, when dividing LIO lne on an array, a layout surface area for division becomes necessary for using an even number of YS (in this case the minimum number is 2) as dummies.

Also, in the 1GDDR, in the case of forming Row/Col fuses for each fuse area as a whole, when a division YS is formed in a redundancy area, the Row/Col number difference enlarges due to using an even number of YS as dummies as mentioned above.

Moreover, in the case of temporarily using the layout region of the 2YS portion and using 1YS portion as a layout separation with the redundancy YS an odd number, a problem arises of the addressing changing on both sides sandwiching the redundancy area. In this case, problems arise such as address SCR correspondence becoming necessary, and when the addressing is different, besides control becoming complicated, the test pattern number increases, leading to an increase in the test time.

A first embodiment of the present invention will be now described herein with reference to the drawings. Those skilled in the art will recognize that many alternative embodiments can be accomplished using the teachings of the present invention and that the invention is not limited to the embodiments illustrated for explanatory purposes.

In 1GDDR, there is need to perform LIO division on a mat for 8-bit prefetch. In the present embodiment, LIO line is divided in two using a portion of redundancy YS of an even number (for example 6×2) that constitute the redundancy YS. An odd number of redundancy YS is adopted (for example, 5) for each mat area (3 mats/2) that corresponds to the divided LIO.

Figure 1:
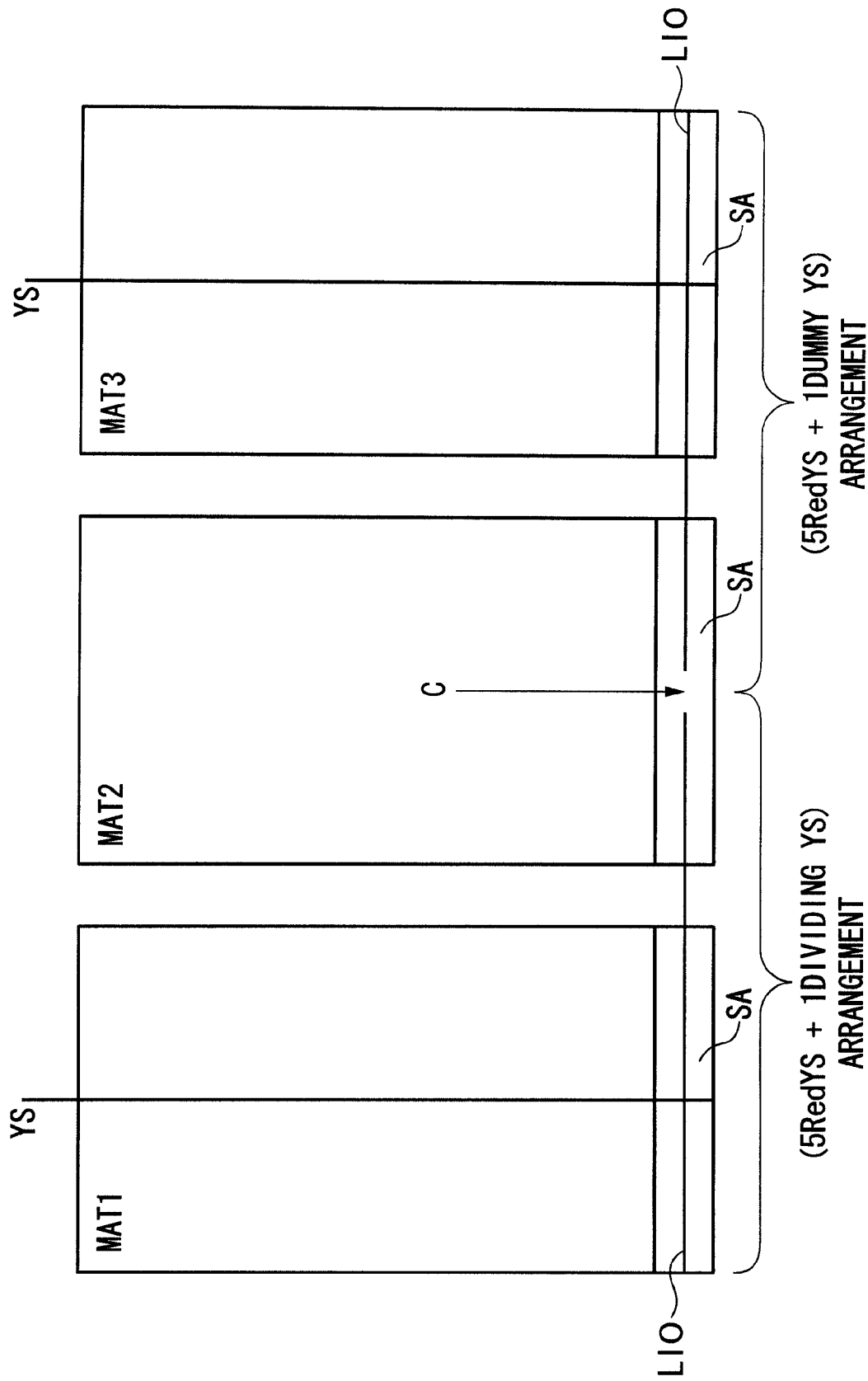
FIG. 1 shows an image of cutting an LIO in the semiconductor memory device of a first embodiment of the present invention.

FIG. 1 shows the LIO division method in the semiconductor memory device of the present invention. As shown in FIG. 1, among the three mats MAT1, MAT2 and MAT3, the LIO division (indicated by "C") is performed on MAT2 which is positioned in the middle. In this case, the mat area that corresponds to each mat that is divided in two becomes 1.5 mats (i.e., 3 mats/2) having approximately 270 kbit memory capacity.

Two YSs are selected in FIG. 1, and by turning them ON simultaneously, a signal is transmitted from BL (bit line) to each LIO line, and 8-bit prefetch is performed.

Figure 2:
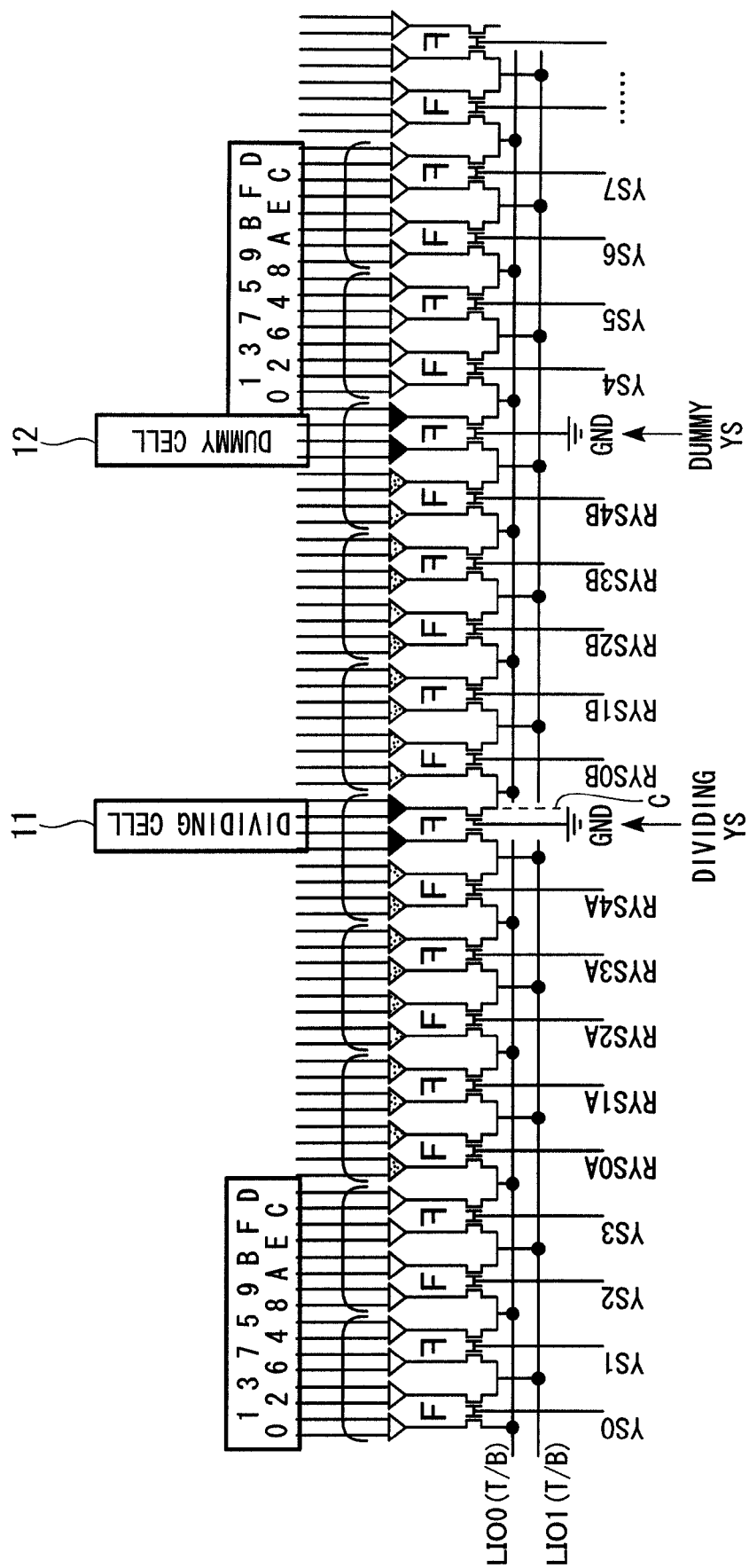
FIG. 2 is a wiring diagram of the SA portion in the semiconductor memory device of the embodiment of the present invention.

FIG. 2 shows a redundancy area that is positioned near the center in the column direction in MAT2 in the middle of the three mats shown in FIG. 1.

In the case of performing the aforementioned LIO division, the LIO division is performed in the middle of MAT2 in the column direction. That is, LIO line is cut at the position of the dividing YS position between the redundancy YS signal lines RYS4A and RYS0B. The five divided YSs on the left side are used as redundancy YSs connected to redundancy YS signal lines RYS0A to RYS4A. The five divided YSs on the right side are used as redundancy YSs connected to redundancy YS signal lines RYS0B to RYS4B. The one YS on the right side of redundancy YS signal line RYS4B is a dummy YS. In this way, the redundancy YSs for replacement are each an odd number (in this example, five) on the right and left side regions that are divided. Thereby, the collapse of the addressing configuration is averted by performing the LIO division in the dividing YS position, and providing one dummy YS in the right side region.

That is, among the 12 redundancy YSs that are arranged in the redundancy area of MAT2, the half on the left side are set as "5 redundancy YS+1 dividing YS" arrangement, and the half on the right side is set as "5 redundancy YS+1 dummy YS" arrangement.

Note, in 1GDDR3 of the present invention, the memory cell block of 1.5 mats (3 mats/2) shown in FIG. 1 is constituted by arranging 16 memory banks each having 64 Mbit capacity. The 16 memory banks are arranged in the word line and bit line directions with 8 banks each are arranged on the upper side/lower side.

As shown in FIG. 2, a dividing cell 11 is assigned to a position that corresponds to the dividing YS, and a dummy cell 12 is assigned to a position that corresponds to a dummy YS for addressing maintenance.

Note that the MAT2 shown in FIG. 1 is actually constituted by 80 YSs, 10 redundancy YSs (RYS0A to RYS4A, RYS0B to RYS4B), the dividing YS, and the dummy YS, for a total of 92. However, in order to describe the LIO cut in the redundancy area, only the redundancy YSs (RYS0A to RYS4A, RYS0B to RYS4B) and the YSs in that vicinity (YS0 to YS3, YS4 to YS7 . . . ) are shown.

(Description of the Row/Column Fuse Number Adjustment)

Because the Row/Col fuses are formed en masse in each Row/Col fuse area, in order to make the difference between the row side and column side fuse number small, a replacement number selection by an odd number may be necessary (also with cases of even number selection).

As described above, in the 3-mat architecture of the related art, the division using YS of an odd number is impossible due to layout considerations. In the present embodiment, using two YS regions among the redundancy YS of an even number (12), "1 dividing YS+1 LIO dividing cell" and "1 dummy YS+1 dummy cell" are created, and the redundancy YS of an odd number (5) per 1.5 mat is constituted.

Figure 3:
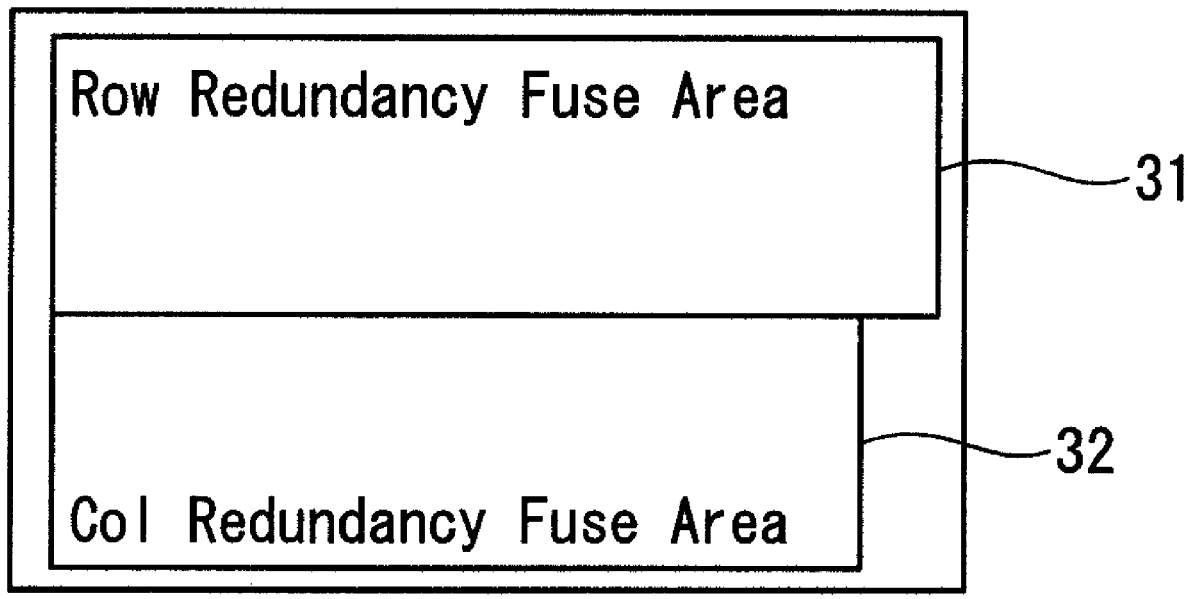
FIG. 3 shows a layout image of the fuse area in the peripheral arrangement in the semiconductor memory device of the embodiment of the present invention.

FIG. 3 shows a fuse area layout image that is arranged in the peripheral region of the memory cell. As shown in FIG. 3, the Row/Col fuses are formed in the row fuse area 31 and the col fuse area 32 en masse, but in order to organize the Row/Col fuse number, a replacement number selection by an odd number may be necessary.

The tables in FIG. 4 show three conditions of replacement specification proposals for 1GDDR3. The specification (2) is the case of the present embodiment.

The fuse number shown in the tables of FIG. 4 is an example in the case of 1GDRAM being constituted by 8 banks each on the upper side and lower side, that is 16 banks. Each of the banks has a capacity of 64M bit.

Figure 13:
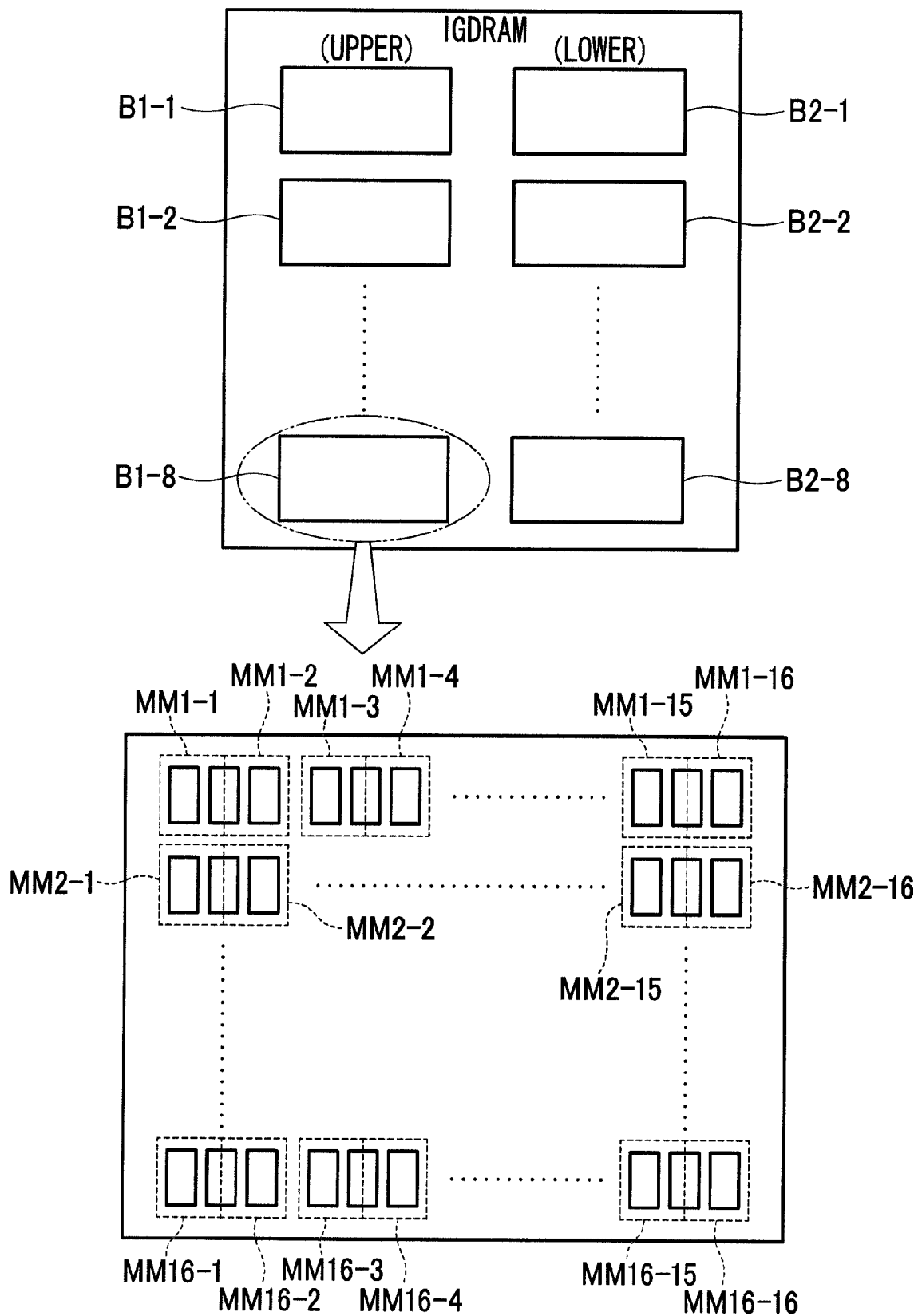
FIG. 13 shows a structure of 1 Gigabit DRAM according to the embodiment of the present invention.

More specifically, as shown in FIG. 13, 1GDRAM has 16 pieces of memory banks B1-1, B1-2, . . . B1-8, B2-1, B2-2, . . . B2-8 arranged in the word line direction and the bit-line direction. The memory banks B1-1 to B1-8 are arranged on the upper side while the memory banks B2-1 to B2-8 are arranged on the lower side. Each of the memory banks, for instance, the memory bank B1-8 has 16×16 pieces of 1.5 mat (3mat/2) areas MM 1-1, MM1-2, . . . MM1-16, MM2-1, . . . MM2-16, . . . MM16-1, MM16-2, . . . MM16-16 arranged in the word line direction and the bit-line direction.

The fuse number on the row side is found by arranging the X address setting fuse in address X0 to X12, and setting the EnableFuse to one, as "(replacement specification)×(14:13 of X0-X12+1 of EnableFuse)×16(Bank)".

Here, in the replacement specification, 64(4×16), 48(3×16), 32(2×16) which are integral multiples of 16 are selected with respect to the 1 memory bank of 64M (Row side is divided into 16).

For example, the fuse number in the case of the replacement specification 64R/64M in the specification (1) is

"64×14×16=14336".

The fuse number on the col side is found by arranging the Y address setting fuse in Y3 to Y9, and setting the EnableFuse to one, as "(replacement specification)×(8:7 of Y3 to Y9+1 of EnableFuse)×16(Mat)×16(Bank)".

For example, the fuse number in the case of the replacement specification 6C/4M in the specification (1) is

"6×8×16×16=12288".

Note that 6C/4M of the replacement specification means providing 6 redundancy YS with respect to memory of 4M (1.5 mat×16). In the embodiment of the present invention shown in the specification (2), it is possible to select 5C/4M that is an odd number (5) described above in this replacement specification.

In the specification (1) shown in FIG. 4, the replacement number that depends on the redundancy is numerous, but the row and col number difference is great, so that the wasted area increases. In specification (3), the redundancy replaceable number is decreased, leading to a state of the fuse area being estimated small. If the specification (2) is selected, it is possible to make the row/col number difference small. With the specification (2), it is possible to make the redundancy YS an odd number (5), and perform LIO division on a mat.

In the semiconductor memory device, since YS division of an odd number is not possible to due layout considerations as described later, two YS regions are used. In this case, two types of YS "1 dividing YS+1 LIO dividing cell" and "1 dummy YS+1 dummy cell" are created, and redundancy YS of an odd number are arranged for each mat area (3 mats/2) that corresponds to the divided LIO.

Thereby, it is possible to divide LIO in two, and it is possible to avoid the addressing configuration breaking up in the case of the redundancy YS being an odd number. Also, it becomes possible to select the odd number replacement of the redundancy YS, and it is possible to reduce the Row/Column fuse number difference.

In the semiconductor memory device, by using the 3-mat architecture of a DDR2 semiconductor memory device (SDRAM or the like), it is possible to perform LIO division, and it is possible to realize 8-bit prefetch in DDR3.

In the semiconductor memory device having the above constitution, in the case of constituting by mating the row redundancy fuse area and the col redundancy fuse area, it is possible to select a replacement number of an odd number, and possible to per adjustment so that the difference of the row side and column side fuse number decreases.

In the semiconductor memory device as described above, it is possible to divide the LIO on the mat for realizing 8-bit prefetch, it is possible to select an odd number replacement, and it is possible to reduce the row and column fuse number difference per 1 chip. Also, the layout shape of the SA (sense amplifier) is made the same size as DDR2, and it is possible to place the redundancy YS with the addressing configuration maintained.

As described above, in the semiconductor memory device of the exemplary embodiment according to the present invention, LIO cutting is performed on the mat that is disposed in the middle among the three mats by using a region that is a part of the even number redundancy YS that constitute the redundancy YS (a region consisting of two redundancy YS). In this case, the cell of one side that is disposed as a dummy cell serves as a LIO dividing cell, and one more serves as a dummy cell for YS addressing constitution maintenance. Thereby, it is possible to divide the LIO for realizing 8-bit prefetch on a mat. Also, odd number replacement can be selected, and it is possible to make the row and column fuse number difference small per 1 chip. Also, the layout shape of the sense amplifier (SA) is made the same as for DDR2, and it is possible to constitute a redundancy YS while maintaining addressing.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A semiconductor memory device, comprising:
a memory cell array that is arrayed on a plurality of mats;
an even number of redundancy Y switch signal lines that are provided in three mat units and arranged in the bit line direction on the mat that is positioned in the middle among the three mats that are disposed continuously in the word line direction;
a local input/output (LIO) line that is connected to a sense amplifier portion of the three mats, extends in the word line direction, and is divided in two in a redundancy area that is a part of the even number of redundancy Y switch signal lines; and
a plurality of bit line selecting Y switch signal lines that connect bit line output of the memory cell array on the three mats to the local input/output line;
wherein 8-bit data prefetch is performed from the three mats by selecting the plurality of bit line selecting Y switch signal lines and turning them ON simultaneously so as to connect the selected bit line output to each local input/output line divided in two.

2. The semiconductor memory device according to claim 1, further comprising:
a first Y switch for dividing that includes one dividing Y switch signal line and one LIO dividing cell, and a second Y switch for a dummy that includes one dummy Y switch and one dummy cell, the first and second Y switches being provided in 2 redundancy areas of the redundancy Y switch signal line; and
an odd number of redundancy Y signal lines arranged in each 1.5 mat area that is assigned to the local input/output line that is divided.

3. The semiconductor memory device according to claim 2, wherein the odd number of redundancy Y switch signal lines is 5.

4. The semiconductor memory device according to claim 1, wherein the semiconductor memory device is a double data rate 3 dynamic random access memory having a 1 Gigabit memory capacity (1GDDR3).

5. A semiconductor memory device, comprising:
a memory cell array that is arrayed on a plurality of mats;
an even number of redundancy Y switch signal lines that are provided in odd number of mat units and arranged in the bit line direction on the mat that is positioned in the middle among the odd number of mats that are disposed in the word line direction;
a local input/output (LIO) line connected to a sense amplifier portion of the odd number of mats, and extends in the word line direction, the local LIO being divided in a redundancy area that is a part of the even number of redundancy Y switch signal lines; and
a plurality of bit line selecting Y switch signal lines connecting bit line output of the memory cell array on the odd number of mats to the local input/output line.

6. A semiconductor memory device, comprising:
first, second, and third mats in which a plurality of memory cells are arrayed, the first, second, and third mats being arranged in a word line direction such that the second mat being arranged between the first and third mats;
a plurality of sense amplifiers connected to a plurality of bit lines, respectively, of the memory cells in the first, second, and third mats;
a plurality of bit line selecting Y switches connected to a plurality of the sense amplifiers, respectively, to conduct outputs of the sense amplifiers;
first redundancy Y switches, second redundancy Y switches, a dividing Y switch and a dummy Y switch connected to associated sense amplifiers located at substantially center portion of the second mat in the word line direction, the dividing Y switch being located between the first redundancy Y switches and the second redundancy Y switches, both of which are of odd numbers; and
local input/output lines coupled to a plurality of the sense amplifiers via the bit line selecting Y switches, the first redundancy switches and the second redundancy switches, the local input and output lines being divided at a portion of the dividing Y switch.

7. The semiconductor memory device according to claim 6, wherein the local input/output lines include:
a first portion coupled to the sense amplifiers connected to the first mat and one half of the second mat via the bit line selecting Y switches and via the first redundancy Y switches, respectively; and
a second portion coupled to the sense amplifiers connected to the third mat and the other half of the second mat via the bit line selecting Y switches and via the second redundancy Y switches, respectively.

8. The semiconductor memory device according to claim 7, further comprising:
- means for selecting one of the plurality of bit line selecting Y switches to conduct one of the sense amplifiers connected to the first mat and the one half of the second mat, and for selecting one of the plurality of bit line selecting Y switches to conduct one of the sense amplifiers connected to the third mat and the other half of the second mat; and
- means for turning the selected two of the bit line selecting Y switches ON simultaneously so as to connect the selected bit line outputs to the first portion and second portion, respectively, of the local input/output lines.

9. A method for dividing a local input/output line in a semiconductor memory device in which a memory cell array is constituted as a plurality of mats, and a plurality of redundancy Y switch signal lines are arranged in three mat units continuously arranged in the word line direction, comprising:
- dividing in two a local input/output line that is connected to a sense amplifier portion for the three mats, the dividing being carried out on the mat that is positioned in the middle among the three mats and using an area of a part of the even number of redundancy Y switch signal lines that constitute the redundancy Y switch signal lines; and
- performing 8-bit prefetch using the three mats by simultaneously turning ON the Y switch signal lines that are connected to each local input/output line divided in two.

* * * * *